United States Patent
Emesh

(10) Patent No.: US 10,665,503 B2
(45) Date of Patent: May 26, 2020

(54) SEMICONDUCTOR REFLOW PROCESSING FOR FEATURE FILL

(71) Applicant: APPLIED Materials, Inc., Santa Clara, CA (US)

(72) Inventor: Ismail T. Emesh, Santa Clara, CA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 13/801,786

(22) Filed: Mar. 13, 2013

(65) Prior Publication Data

US 2014/0008812 A1 Jan. 9, 2014

Related U.S. Application Data

(60) Provisional application No. 61/638,856, filed on Apr. 26, 2012, provisional application No. 61/638,851, filed on Apr. 26, 2012.

(51) Int. Cl.
*H01L 21/768* (2006.01)
*H01L 21/321* (2006.01)

(52) U.S. Cl.
CPC ...... *H01L 21/76882* (2013.01); *H01L 21/321* (2013.01); *H01L 21/76898* (2013.01)

(58) Field of Classification Search
CPC ............ H01L 21/768; H01L 21/76882; H01L 21/76898; H01L 21/2885; H01L 21/76864; H01L 21/76873; H01L 21/76846; H01L 21/288; H01L 21/76843; H01L 21/76861; H01L 2221/1089
USPC .................................................. 438/632, 646
See application file for complete search history.

(56) References Cited

U.S. PATENT DOCUMENTS

| | | | |
|---|---|---|---|
| 6,077,780 A | 6/2000 | Dubin | |
| 6,228,759 B1 | 5/2001 | Wang et al. | |
| 6,368,966 B1 * | 4/2002 | Krishnamoorthy et al. | 438/687 |
| 6,506,668 B1 * | 1/2003 | Woo et al. | 438/584 |
| 6,727,176 B2 | 4/2004 | Ngo et al. | |
| 6,998,337 B1 * | 2/2006 | Tran | H01L 21/2885 257/E21.175 |
| 8,513,124 B1 * | 8/2013 | Ponnuswamy | C25D 7/123 257/E21.575 |
| 8,517,769 B1 * | 8/2013 | Lin et al. | 439/629 |
| 9,129,945 B2 | 9/2015 | Lee et al. | |

(Continued)

FOREIGN PATENT DOCUMENTS

| | | |
|---|---|---|
| CN | 1582491 A | 2/2005 |
| CN | 101651117 A | 2/2010 |

(Continued)

OTHER PUBLICATIONS

Non-Final Office Action dated Aug. 27, 2014, from U.S. Appl. No. 13/801,860, filed Mar. 13, 2013, 14 pages.

(Continued)

*Primary Examiner* — Mohammed R Alam
(74) *Attorney, Agent, or Firm* — Christensen O'Connor Johnson Kindness PLLC

(57) ABSTRACT

A method for at least partially filling a feature on a workpiece generally includes obtaining a workpiece including a feature depositing a first conformal conductive layer in the feature, and thermally treating the workpiece to reflow the first conformal conductive layer in the feature.

18 Claims, 12 Drawing Sheets

(56) References Cited

U.S. PATENT DOCUMENTS

| | | | |
|---|---|---|---|
| 9,245,798 B2* | 1/2016 | Emesh | H01L 21/76882 |
| 2002/0008034 A1* | 1/2002 | Chen et al. | 205/82 |
| 2003/0087522 A1 | 5/2003 | Ngo et al. | |
| 2003/0139033 A1* | 7/2003 | Gardner | 438/632 |
| 2005/0045485 A1* | 3/2005 | Shih | C25D 3/38 |
| | | | 205/123 |
| 2005/0082676 A1* | 4/2005 | Andry et al. | 257/763 |
| 2007/0049005 A1* | 3/2007 | Kim | 438/622 |
| 2007/0148944 A1* | 6/2007 | Lee | 438/597 |
| 2007/0152306 A1* | 7/2007 | Shih et al. | 257/642 |
| 2008/0073787 A1* | 3/2008 | Oh | H01L 21/2885 |
| | | | 257/751 |
| 2008/0213994 A1* | 9/2008 | Chebiam | H01L 21/288 |
| | | | 438/643 |
| 2008/0305617 A1* | 12/2008 | Ryan et al. | 438/466 |
| 2009/0026618 A1* | 1/2009 | Kim et al. | 257/751 |
| 2009/0061629 A1* | 3/2009 | Preusse | H01L 21/02068 |
| | | | 438/680 |
| 2009/0120799 A1* | 5/2009 | Sun et al. | 205/224 |
| 2009/0160055 A1* | 6/2009 | Lavoie | 257/751 |
| 2010/0041226 A1* | 2/2010 | Reid | C25D 3/38 |
| | | | 438/614 |
| 2010/0285660 A1* | 11/2010 | Lin et al. | 438/650 |
| 2011/0027991 A1* | 2/2011 | Chang | H01L 21/28556 |
| | | | 438/680 |
| 2011/0121427 A1* | 5/2011 | Stupar et al. | 257/532 |
| 2012/0049371 A1* | 3/2012 | Chang et al. | 257/751 |
| 2012/0261254 A1 | 10/2012 | Reid | |
| 2012/0264290 A1* | 10/2012 | Reid | C25D 7/123 |
| | | | 438/653 |
| 2013/0214414 A1* | 8/2013 | Edelstein et al. | 257/751 |
| 2013/0320505 A1 | 12/2013 | Emesh | |
| 2014/0124361 A1 | 5/2014 | Reid | |

FOREIGN PATENT DOCUMENTS

| | | |
|---|---|---|
| CN | 101740420 A | 6/2010 |
| JP | 2000-174026 A | 6/2000 |
| KR | 10-2005-0122629 A | 12/2005 |
| TW | 201145461 A1 | 12/2011 |

OTHER PUBLICATIONS

Final Office Action dated Feb. 25, 2015, from U.S. Appl. No. 13/801,860, filed Mar. 13, 2013, 13 pages.

Taiwan Office Action and Search Report dated Aug. 11, 2016, issued in corresponding Taiwan Application No. 102112724, filed Apr. 10, 2013, 9 pages.

Notice of Final Rejection for Korean Patent Application No. 10-2013-0046007, dated Mar. 4, 2020, 8 pages.

Notice of Reasons for Rejection for Korean Patent Application No. 10-2013-0046001, dated Jan. 30, 2020, 8 pages.

* cited by examiner

ECD SEED PLUS - PROCESS FLOW EXAMPLE

| ITEM | PROCESS FLOW | BARRIER | SEC. SEED | LINER | SEED | FLASH | ECD SEED | ECD SEED PLUS | ECD |
|---|---|---|---|---|---|---|---|---|---|
| 1 | MAIN DAMASCENE | 1 | | | 2 | | | | 3 |
| 2 | ECD SEED (SLE) | 1 | | | 2 | | 3 | | 4 |
| 3 | ECD SEED (SLE) W/ LINER | 1 | | 2 | 3 | | 4 | | 5 |
| 4 | ECD SEED (SLE) W/ SECONDARY SEED | 1 | 2 | | | | 3 | | 4 |
| 5 | ECD SEED (SLE) W/ SEC. SEED AND FLASH | 1 | 2 | | | 3 | 4 | | 5 |
| 6 | ECD SEED (DOB) | 1 | | | | | 2 | | 3 |
| 7 | ECD SEED PLUS (DOB) | 1 | | | | | | 2 | 3 |
| 8 | ECD SEED PLUS | 1 | 2 | | | | | 3 | 4 |
| 9 | ECD SEED PLUS W/O ECD | 1 | 2 | | | | | 3 | |
| 10 | ECD SEED PLUS W/O SECONDARY SEED | 1 | | 2 | | | | 3 | 4 |
| 11 | ECD SEED PLUS W/ LINER W/ SEED | 1 | | 2 | 3 | | | 4 | 5 |

Fig. 2.

PROCESS FLOW EXAMPLE - ECD SEED (SLE)

PROCESS FLOW EXAMPLE - SECONDARY SEED W/ FLASH

ECD SEED PLUS - LOT B50509 - DOE SPLIT TABLE

| SPLIT ITEM | SPLIT ITEM NAME | WAFER 1 ECD SEED (THICK) | WAFER 4 ECD SEED PLUS | WAFER 5 ECD SEED PLUS | WAFER 7 ECD SEED |
|---|---|---|---|---|---|
| 1 | BARRIER | 10Å ALD TaN | 10Å ALD TaN | 10Å ALD TaN | 10Å ALD TaN |
| 2 | SEC. SEED | 30Å CVD Ru | 30Å CVD Ru | 30Å CVD Ru | 30Å CVD Ru |
| 3 | INITIAL ANNEAL | 300°C WITH 10 MIN. N₂ | 300°C WITH 10 MIN. N₂ | 300°C WITH 10 MIN. N₂ | 300°C WITH 10 MIN. N₂ |
| 4 | ECD SEED | 2.1 AMP-MIN | 0.7 AMP-MIN | 0.5 AMP-MIN | 0.5 AMP-MIN |
| 5 | ANNEAL | - | 300°C | 300°C | - |
| 6 | ECD SEED | - | 0.7 AMP-MIN | 0.5 AMP-MIN | - |
| 7 | ANNEAL | - | 300°C | 300°C | - |
| 8 | ECD SEED | - | 0.7 AMP-MIN | 0.5 AMP-MIN | - |
| 9 | ANNEAL | - | - | 300°C | - |
| 10 | ECD SEED | - | - | 0.5 AMP-MIN | - |
| 11 | ECD | FINISH FILL AND CAP | FINISH FILL AND CAP | FINISH FILL AND CAP | FINISH FILL AND CAP |

Fig. 8.

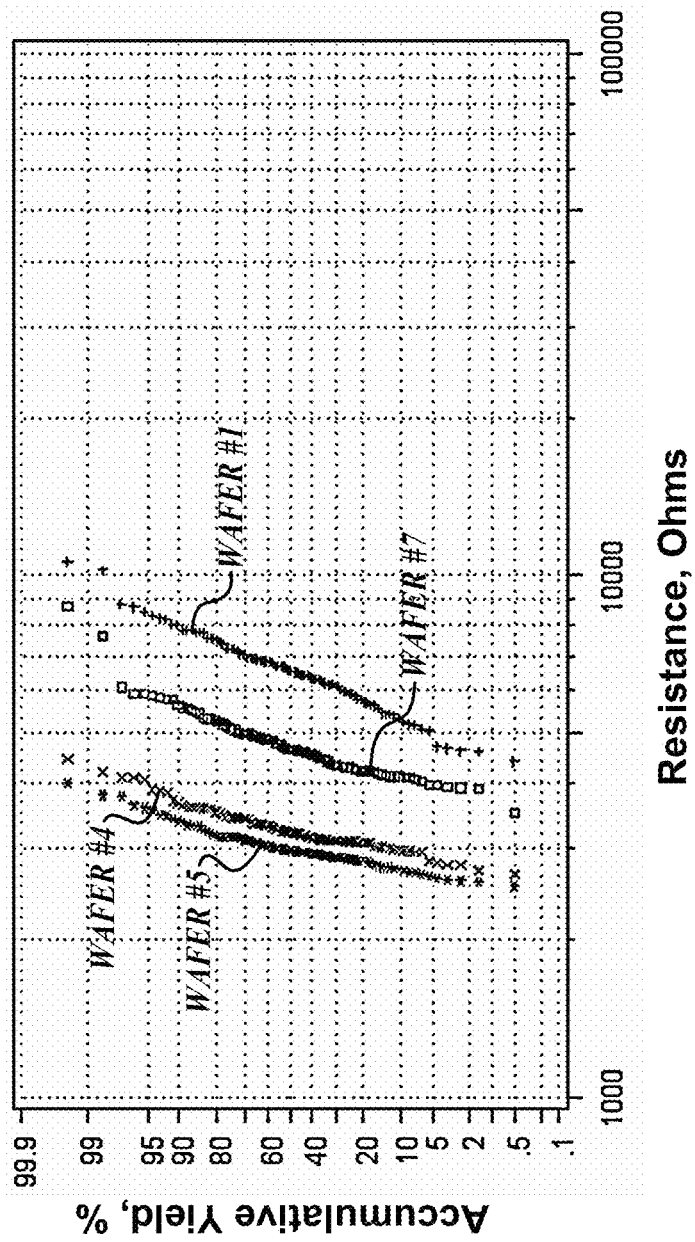

*ECD SEED PLUS, SIDE VIEW, TEM*

SEMICONDUCTOR REFLOW PROCESSING FOR FEATURE FILL

CROSS-REFERENCES TO RELATED APPLICATIONS

This application claims the benefit of U.S. Provisional Application No. 61/638,851 and U.S. Provisional Application No. 61/638,856, both filed Apr. 26, 2012, the disclosures of which are hereby expressly incorporated by reference herein in their entirety.

BACKGROUND

The present disclosure relates to methods for electrochemically depositing a conductive material, for example, a metal, such as copper (Cu), cobalt (Co), nickel (Ni) gold (Au), silver (Ag), manganese (Mn), tin (Sn), aluminum (Al), and alloys thereof, in features (such as trenches and vias, particularly in Damascene applications) of a microelectronic workpiece.

An integrated circuit is an interconnected ensemble of devices formed within a semiconductor material and within a dielectric material that overlies a surface of the semiconductor material. Devices which may be formed within the semiconductor include MOS transistors, bipolar transistors, diodes, and diffused resistors. Devices which may be formed within the dielectric include thin film resistors and capacitors. The devices are interconnected by conductor paths formed within the dielectric. Typically, two or more levels of conductor paths, with successive levels separated by a dielectric layer, are employed as interconnections. In current practice, copper and silicon oxide are commonly used for, respectively, the conductor and the dielectric.

The deposits in a copper interconnect typically include a dielectric layer, a barrier layer, a seed layer, copper fill, and a copper cap. Because copper tends to diffuse into the dielectric material, barrier layers are used to isolate the copper deposit from the dielectric material. However, for other metal interconnects besides copper, it should be appreciated that barrier layers may not be required. Barrier layers are typically made of refractory metals or refractory compounds, for example, titanium (Ti), tantalum (Ta), titanium nitride (TiN), tantalum nitride (TaN), etc. Other suitable barrier layer materials may include manganese (Mn) and manganese nitride (MnN). The barrier layer is typically formed using a deposition technique called physical vapor deposition (PVD), but may also be formed by using other deposition techniques, such as chemical vapor deposition (CVD) or atomic layer deposition (ALD).

A seed layer may be deposited on the barrier layer. However, it should also be appreciated that direct on barrier (DOB) deposition is also within the scope of the present disclosure, for example, barriers that are made from alloys or co-deposited metals upon which interconnect metals may be deposited without requiring a separate seed layer, such as titanium ruthenium (TiRu), tantalum ruthenium (TaRu), tungsten ruthenium (WRu), as well as other barrier layers that are known and/or used by those having skill in the art.

In one non-limiting example, the seed layer may be a copper seed layer. As another non-limiting example, the seed layer may be a copper alloy seed layer, such as copper manganese, copper cobalt, or copper nickel alloys. In the case of depositing copper in a feature, there are several exemplary options for the seed layer. First, the seed layer may be a PVD copper seed layer. See, e.g., FIG. 3 for an illustration of a process including PVD copper seed deposition. The seed layer may also be formed by using other deposition techniques, such as CVD or ALD.

Second, the seed layer may be a stack film, for example, a liner layer and a PVD seed layer. A liner layer is a material used in between a barrier and a PVD seed to mitigate discontinuous seed issues and improve adhesion of the PVD seed. Liners are typically noble metals such as ruthenium (Ru), platinum (Pt), palladium (Pd), and osmium (Os), but the list may also include cobalt (Co) and nickel (Ni). Currently, CVD Ru and CVD Co are common liners; however, liner layers may also be formed by using other deposition techniques, such as ALD or PVD.

Third, the seed layer may be a secondary seed layer. A secondary seed layer is similar to a liner layer in that it is typically formed from noble metals such as Ru, Pt, Pd, and Os, but the list may also include Co and Ni, and most commonly CVD Ru and CVD Co. (Like seed and liner layers, secondary seed layers may also be formed by using other deposition techniques, such as ALD or PVD.) The difference is that the secondary seed layer serves as the seed layer, whereas the liner layer is an intermediate layer between the barrier layer and the PVD seed. See, e.g., FIGS. 5 and 6 for illustrations of processes including secondary seed depositions, followed by, respectively, ECD seed deposition in FIG. 5, as described below, and flash deposition in FIG. 6. (A "flash" deposition is primarily on the field and at the bottom of the feature, without significant deposition on the sidewalls of the feature.)

After a seed layer has been deposited according to one of the examples described above, the feature may include a seed layer enhancement (SLE) layer, which is a thin layer of deposited metal, for example, copper having a thickness of about 2 nm. An SLE layer is also known as an electrochemically deposited seed (or ECD seed). See, e.g., FIG. 4 for an illustration of a process including PVD seed deposition and ECD seed deposition. See, e.g., FIG. 5 for an illustration of a process including secondary seed deposition and ECD seed deposition. As seen in FIGS. 4 and 5, ECD seed may be a conformally deposited layer.

An ECD copper seed is typically deposited using a basic chemistry that includes a very dilute copper ethylenediamine (EDA) complex. ECD copper seed may also be deposited using other copper complexes, such as citrate, tartrate, urea, etc., and may be deposited in a pH range of about 2 to about 11, about 3 to about 10, or in a pH range of about 4 to about 10.

After a seed layer has been deposited according to one of the examples described above (which may also include an optional ECD seed), conventional ECD fill and cap may be performed in the feature, for example, using an acid deposition chemistry. Conventional ECD copper acid chemistry may include, for example, copper sulfate, sulfuric acid, methane sulfonic acid, hydrochloric acid, and organic additives (such as accelerators, suppressors, and levelers). Electrochemical deposition of copper has been found to be the most cost effective manner by which to deposit a copper metallization layer. In addition to being economically viable, ECD deposition techniques provide a substantially bottom up (e.g., nonconformal) metal fill that is mechanically and electrically suitable for interconnect structures.

Conventional ECD fill, particularly in small features, may result in a lower quality interconnect. For example, conventional ECD copper fill may produce voids, particularly in features having a size of less than 30 nm. As one example of a type of void formed using conventional ECD deposition, the opening of the feature may pinch off. Other types of voids can also result from using the conventional ECD copper fill process in a small feature. Such voids and other intrinsic properties of a deposit formed using conventional ECD copper fill can increase the resistance of the interconnect, thereby slowing down the electrical performance of the device and deteriorating the reliability of the copper interconnect.

Therefore, there exists a need for an improved, substantially void-free metal fill process for a feature. Such substantially void-free metal fill may be useful in a small feature, for example, a feature having an opening size of less than 30 nm.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one embodiment of the present disclosure, a method for at least partially filling a feature on a workpiece is provided. The method generally includes obtaining a workpiece including a feature, depositing a first conformal conductive layer in the feature, and thermally treating the workpiece to reflow the first conformal conductive layer in the feature.

In accordance with another embodiment of the present disclosure, a method for at least partially filling a feature on a workpiece is provided. The method generally includes obtaining a workpiece including a feature, depositing a barrier layer in the feature, and depositing a first conductive layer in the feature after the barrier layer, wherein the first conductive layer is a seed layer. The method further includes depositing a second conductive layer in the feature after the first conductive layer, wherein the second conductive layer is a conformal conductive layer, and annealing the workpiece to reflow the second conductive layer in the feature.

In accordance with another embodiment of the present disclosure, a workpiece is provided. The workpiece generally includes at least one feature having a size of less than 30 nm, and a substantially void-free conductive layer in the feature.

DESCRIPTION OF THE DRAWINGS

The foregoing aspects and many of the attendant advantages of this disclosure will become more readily appreciated by reference to the following detailed description, when taken in conjunction with the accompanying drawings, wherein:

FIG. 2 is a comparison chart of exemplary process steps that may be used in conjunction with prior art processes and processes according to embodiments of the present disclosure;

FIG. 8 is a graphical depiction of exemplary process steps for deposition in Damascene features having feature diameters of about 30 nm according to the embodiments of the present disclosure for various exemplary wafers;

FIG. 9 is a graphical depiction of 120 micron long line resistor resistance results obtained from exemplary wafers described in FIG. 8;

DETAILED DESCRIPTION

Embodiments of the present disclosure are directed to workpieces, such as semiconductor wafers, devices or processing assemblies for processing workpieces, and methods of processing the same. The term workpiece, wafer, or semiconductor wafer means any flat media or article, including semiconductor wafers and other substrates or wafers, glass, mask, and optical or memory media, MEMS substrates, or any other workpiece having micro-electric, micromechanical, or microelectro-mechanical devices.

Processes described herein are to be used for metal or metal alloy deposition in features of workpieces, which include trenches and vias. In one embodiment of the present disclosure, the process may be used in small features, for example, features having a feature diameter of less than 30 nm. However, it should be appreciated that the processes described herein are applicable to any feature size. The dimension sizes discussed in the present application are post-etch feature dimensions at the top opening of the feature. The processes described herein may be applied to various forms of copper, cobalt, nickel, gold, silver, manganese, tin, aluminum, and alloy deposition, for example, in Damascene applications. In embodiments of the present disclosure, Damascene features may be selected from the group consisting of features having a size of less than 30 nm, about 5 to less than 30 nm, about 10 to less than 30 nm, about 15 to about 20 nm, about 20 to less than 30 nm, less than 20 nm, less than 10 nm, and about 5 to about 10 nm.

Figure 1:
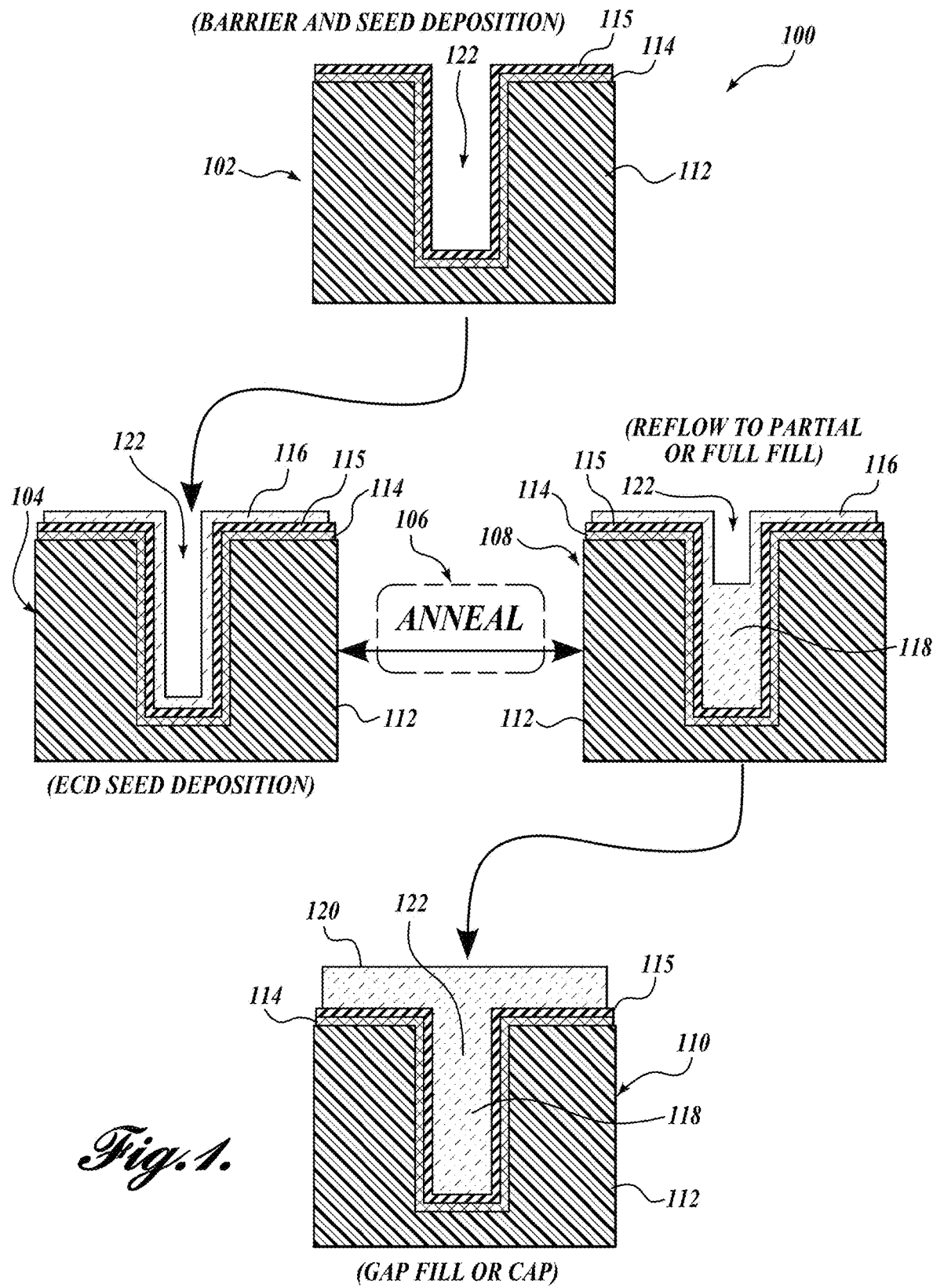
FIG. 1 is a schematic flow diagram depicting the process steps and an exemplary feature development of an exemplary embodiment of the present disclosure.
Figure 3:
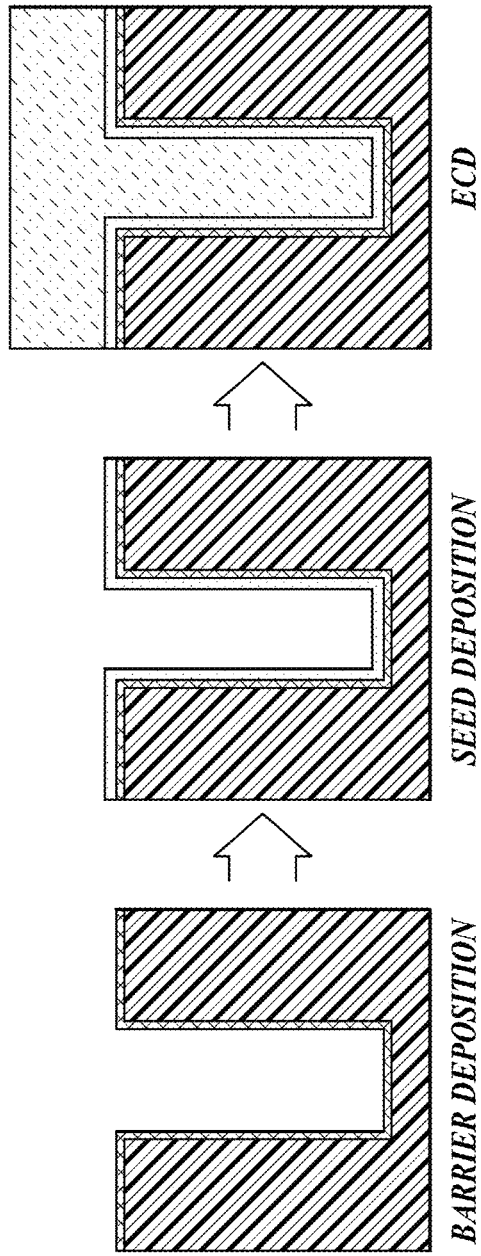
FIG. 3 is a schematic process diagram depicting the process steps and an exemplary feature development using a prior art main Damascene process, including barrier deposition, seed deposition, and conventional ECD fill and cap deposition.
Figure 4:
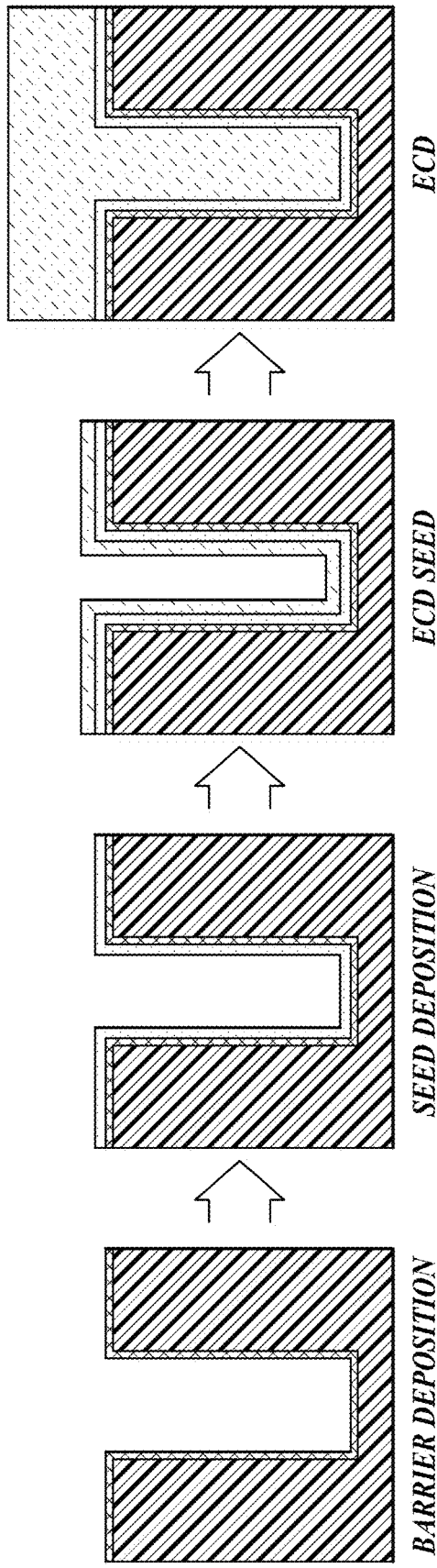
FIG. 4 is a schematic process diagram depicting the process steps and an exemplary feature development using a prior art SLE (also know as ECD seed) process, including barrier deposition, seed deposition, ECD seed deposition, and conventional ECD fill and cap deposition.
Figure 5:
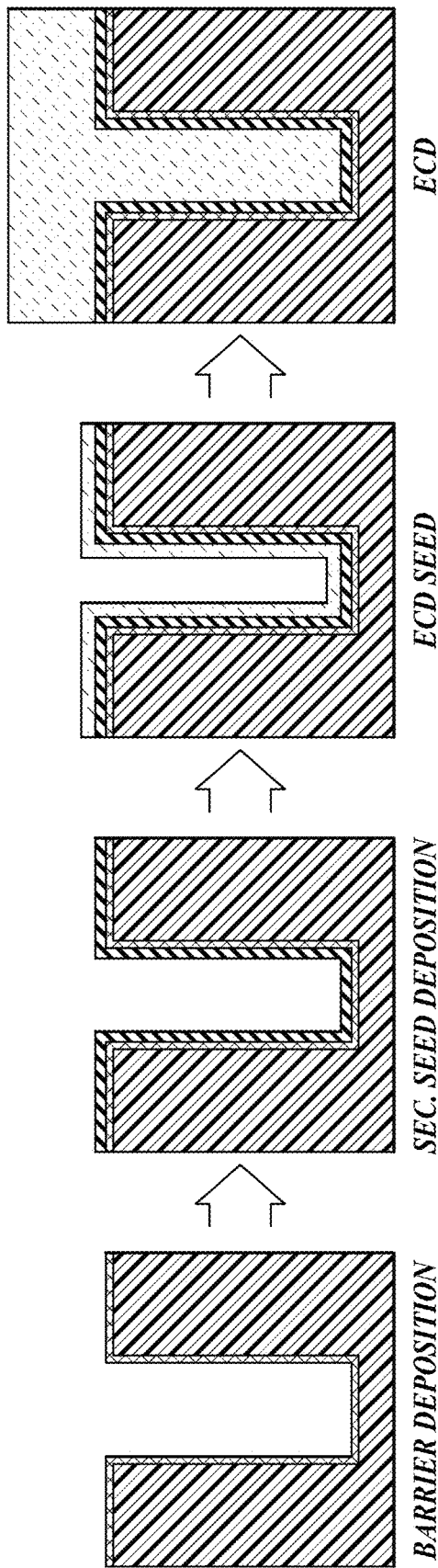
FIG. 5 is a schematic process diagram depicting the process steps and an exemplary feature development using a prior art ECD seed process, including barrier deposition, secondary seed deposition, ECD seed deposition, and conventional ECD fill and cap deposition.
Figure 6:
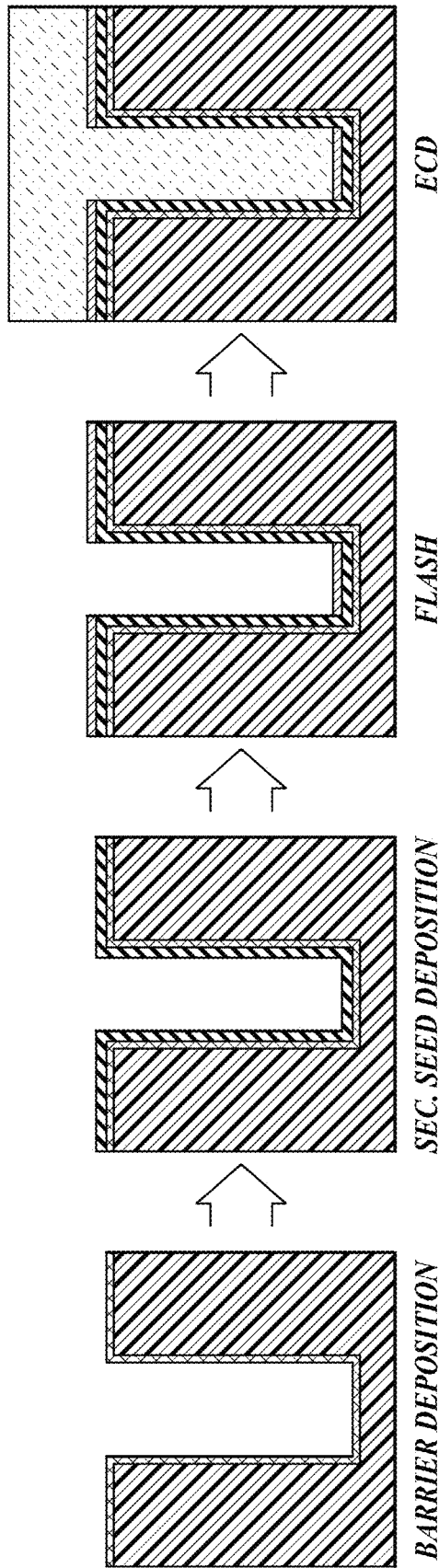
FIG. 6 is a schematic process diagram depicting the process steps and an exemplary feature development using a prior art deposition on secondary seed process with a flash layer, including barrier deposition, secondary seed deposition, flash deposition, and conventional ECD fill and cap deposition.

It should be appreciated that the descriptive terms "microfeature workpiece" and "workpiece" as used herein include all structures and layers that have been previously deposited and formed at a given point in the processing, and is not limited to just those structures and layers as depicted in FIG. 1.

It should be appreciated that processes described herein may also be modified for metal or metal alloy deposition in high aspect ratio features, for example, vias in through silicon via (TSV) features, as described in U.S. patent application Ser. No. 13/801,860, filed on Mar. 13, 2013 (now U.S. Pat. No. 9,245,798, the disclosure of which is incorporated by reference herein in its entirety.

Although generally described as metal deposition in the present application, it should be appreciated that the term "metal" also contemplates metal alloys. Such metals and metal alloys may be used to form seed layers or to fully or partially fill the feature. Exemplary copper alloys may include, but are not limited to, copper manganese and copper aluminum. As a non-limiting example, the alloy composition ratio may be in the range of about 0.5% to about 6% secondary alloy metal, as compared to the primary alloy metal (e.g., Cu, Co, Ni, Ag, Au, etc.).

As described above, the conventional fabrication of metal interconnects may include a suitable deposition of a barrier layer on the dielectric material to prevent the diffusion of metal into the dielectric material. Suitable barrier layers, which may include, for example, Ta, Ti, TiN, TaN, Mn, or MnN. Suitable barrier deposition methods may include PVD, ALD and CVD; however, PVD is the most common process for barrier layer deposition. Barrier layers are typically used to isolate copper or copper alloys from dielectric material; however, it should be appreciated that in the case of other metal interconnects, diffusion may not be a problem and a barrier layer may not be required.

The barrier layer deposition may be followed by an optional seed layer deposition. In the case of depositing metal in a feature, there are several options for the seed layer. As described above, the seed layer may be (1) a seed layer (as a non-limiting example, a PVD copper seed layer). The seed layer may be a metal layer, such as copper, cobalt, nickel, gold, silver, manganese, tin, aluminum, ruthenium, and alloys thereof. The seed layer may also be (2) a stack film of a liner layer and a seed layer (as a non-limiting example, a CVD Ru liner layer and a PVD copper seed layer), or (3) a secondary seed layer (as a non-limiting example, a CVD or ALD Ru secondary seed layer). It should be appreciated, however, that other methods of depositing these exemplary seed layers are contemplated by the present disclosure.

As discussed above, a liner layer is a material used in between a barrier layer and a seed layer to mitigate discontinuous seed issues and improve adhesion of the seed layer. Liners are typically noble metals such as Ru, Pt, Pd, and Os, but the list may also include Co and Ni. Currently, CVD Ru and CVD Co are common liners; however, liner layers may also be formed by using other deposition techniques, such as PVD or ALD. The thickness of the liner layer may be in the range of around 5 Å to 50 Å for Damascene applications.

Also discussed above, a secondary seed layer is similar to a liner layer in that it is typically formed from noble metals such as Ru, Pt, Pd, and Os, but the list may also include Co and Ni, and most commonly CVD Ru and CVD Co. The difference is that the secondary seed layer serves as the seed layer, whereas the liner layer is an intermediate layer between the barrier layer and the seed layer. Secondary seed layers may also be formed by using other deposition techniques, such as PVD or ALD.

The liner or secondary seed deposit may be thermally treated or annealed at a temperature between about 100° C. to about 500° C. in a forming gas environment (e.g., 3-5% hydrogen in nitrogen or 3-5% hydrogen in helium) to remove any surface oxides, densify the secondary seed or liner layer, and improve the surface properties of the deposit. The liner or secondary seed deposit may additionally be passivated by the soaking in gaseous nitrogen (N2 gas) or other passivating environments to prevent surface oxidation. Passivation of the liner or secondary seed is described in U.S. Pat. No. 8,357,599, issued Jan. 22, 2013, the disclosure of which is hereby expressly incorporated by reference in its entirety.

After a seed layer has been deposited (such as one of the non-limiting examples of PVD copper seed, PVD copper seed including CVD Ru liner, or CVD Ru secondary seed, or another deposition metal or metal alloy, layer combination, or deposition technique), the feature may include a conformal metal layer after the seed layer. It should also be appreciated, however, that a conformal metal layer may be deposited directly on the barrier layer, i.e., without a seed layer.

In one embodiment of the present disclosure, the conformal layer is deposited using an ECD seed process, and then may be modified using a process that is referred to as ECD seed "plus" deposition (or ECD seed "plus"), which includes a thermal treatment step. In other embodiments of the present disclosure, the conformal layer may be deposited using CVD, ALD, or other deposition techniques, and then may be subject to a thermal treatment step. In accordance with embodiments of the present disclosure, the conformal layer is "flowable" or capable of mobility when subjected to thermal treatment or annealing.

In this embodiment, ECD seed "plus" generally refers to ECD metal seed deposition plus a thermal treatment step, such as an annealing step. In one embodiment of the present disclosure, the thermal treatment step may result in reflow of some or all of the seed deposition. An increase in temperature in the ECD seed layer aids in the mobility of the atoms in the layer and enhances their ability to fill the structure.

Figure 12:
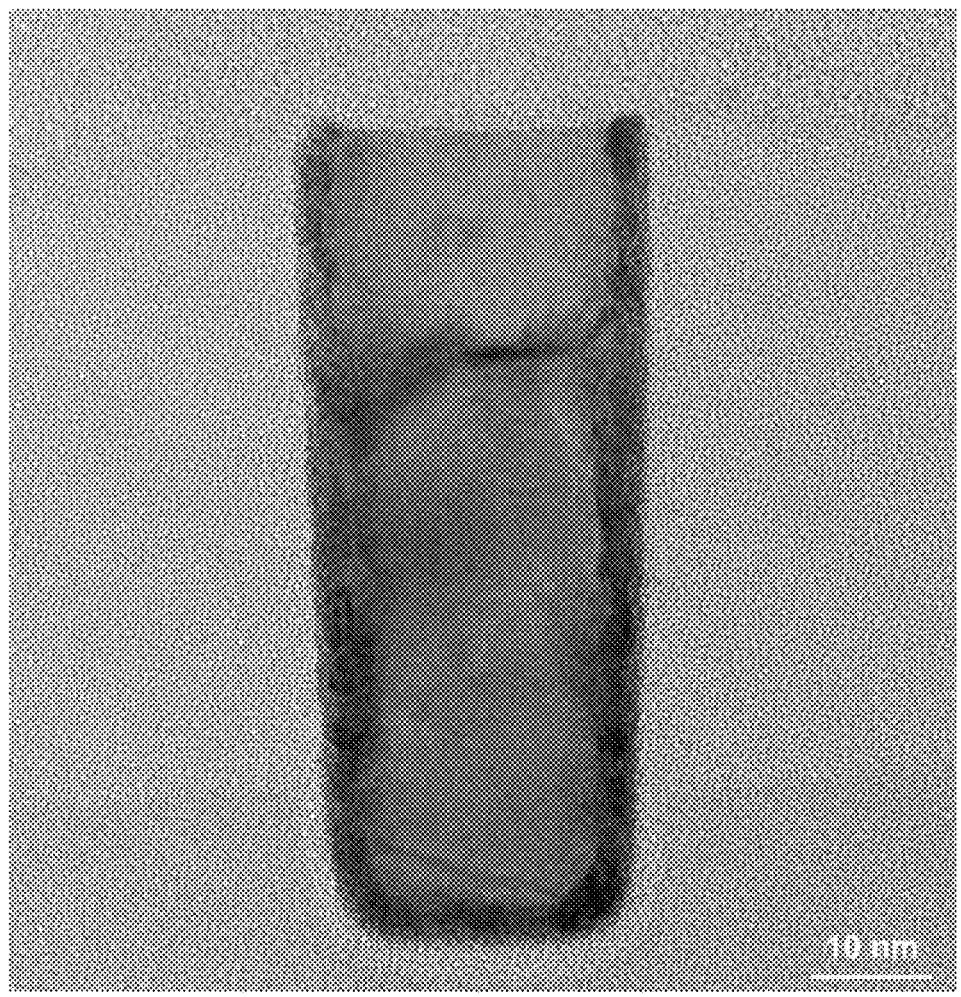
FIG. 12 includes a transmission electron microscopy (TEM) image of substantially void-free gap fill for a Damascene feature having a feature diameter of about 30 nm in accordance with embodiments of the present disclosure.

In contrast to conventional ECD metal fill (using acid chemistry), ECD seed "plus" deposition is similar to ECD seed deposition (using basic chemistry), but adds a thermal treatment step. Moreover, instead of just depositing a seed layer, ECD seed "plus" can be performed so as to partially fill or fully fill the features. With the ECD seed "plus" process, substantially void-free fill of small features can be achieved, as described in greater detail below (see image of substantially void-free fill in a small feature in FIG. 12).

The chemistry used in the ECD chamber for ECD seed "plus" deposition may include a basic chemistry, for example, Cu(ethylenediamine)2 at a pH in the range of about 8 to about 11, in one embodiment of the present disclosure about 8 to about 10, and in one embodiment of the present disclosure about 9.3. It should be appreciated, however, that acidic chemistries using proper organic additives may also be used to achieve conformal ECD seed deposition.

After ECD seed deposition, the workpiece may then be subjected to the spin, rinse, and dry (SRD) process or other cleaning processes. The ECD seed is then heated at a temperature warm enough to get the seed to reflow, but not too hot such that the workpiece or elements on the workpiece are damaged or degraded. For example, the temperature may be in the range of about 100° C. to about 500° C. for seed reflow in the features. Appropriate thermal treatment or annealing temperatures are in the range of about 100° C. to about 500° C., and may be accomplished with equipment capable of maintaining sustained temperatures in the range of about 200° C. to about 400° C., and at least within the temperature range of about 250° C. to about 350° C.

Figure 7:
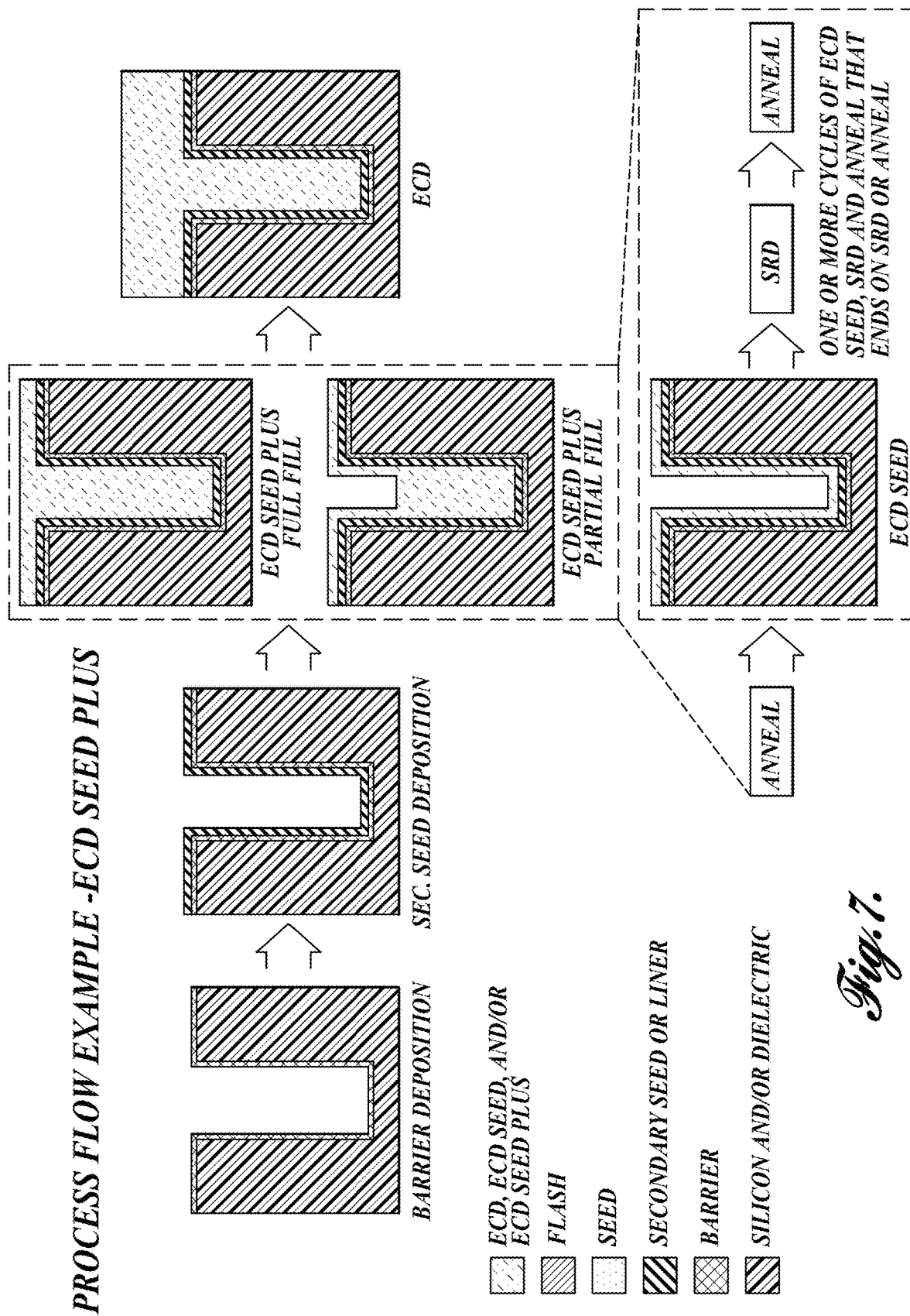
FIG. 7 is a schematic process diagram depicting the process steps and an exemplary feature development of a number of exemplary embodiments of the present disclosure.

The thermal treatment or annealing process may be performed using a forming or inert gas, pure hydrogen, or a reducing gas such as ammonia (NH3). During reflow, the shape of the deposition changes, such that the metal deposit may pool in the bottom of the feature, as shown in FIG. 7. In addition to reflow during the thermal treatment process, the metal deposit may also grow larger grains and reduce film resistivity. An inert gas may be used to cool the workpiece after heating.

After the ECD seed "plus" deposition and thermal treatment process has been completed to either partially or completely fill the feature, a conventional acid chemistry may be used to complete the deposition process for gap fill and cap deposition. The acid chemistry metal deposition step is generally used to fill large structures and to maintain proper film thickness needed for the subsequent polishing step because it is typically a faster process than ECD seed, saving time and reducing processing costs.

As seen in FIGS. 1 and 7, the ECD seed deposition and reflow steps may be repeated to ensure complete filling of the feature with ECD seed. In that regard, processes described herein may include one or more ECD seed deposition, cleaning (such as SRD), and thermal treatment cycles.

Referring to FIG. 1, a reflow process 100 and exemplary features created by the reflow process are depicted. The workpiece 112 may be in an exemplary embodiment a dielectric material on a crystalline silicon workpiece that contains at least one feature 122. In exemplary step 102, the feature 122 is lined with a barrier layer 114 and a seed layer 115. In exemplary step 104, the feature 122 of the workpiece 112 has received a layer of ECD seed material 116 on the seed layer 115. In exemplary anneal step 106, the workpiece is annealed at an appropriate temperature to induce the exemplary reflow step 108 to encourage partial fill or full fill. During the anneal step, ECD seed material 116 flows into the feature 122 to form a fill 118, while having minimal, if any, detrimental effect on the workpiece 112 or the features included therein. In an exemplary embodiment, ECD seed deposition step 104, anneal step 106, and reflow step 108 may be repeated to attain the desired characteristics of fill 118. The number of repeating steps may depend on the structure. Once fill 118 reaches desired dimensions, exemplary cap step 110 may be used to complete the process in which additional material 120 is deposited above the feature in preparation for additional workpiece 112 processing.

Referring now to FIG. 2, process flow examples are provided wherein embodiments of the present disclosure may be used in conjunction with, and integrated into other workpiece surface deposition processes. The previously developed processes will first be described. First, the TSV process includes deposition of a barrier layer, a seed layer, and a conventional ECD fill. Second, the ECD Seed (also known as SLE) process includes deposition of a barrier layer, a seed layer, an ECD seed layer, and a conventional ECD fill. Third, the ECD Seed (SLE) With Liner process includes deposition of a barrier layer, a liner layer, a seed layer, an ECD seed layer, and a conventional ECD fill. Fourth, the ECD Seed (SLE) With Secondary Seed process includes deposition of a barrier layer, a secondary seed layer, an ECD seed layer, and a conventional ECD fill. Fifth, the ECD Seed (SLE) With Secondary Seed and Flash process includes deposition of a barrier layer, a secondary seed layer, a flash layer, an ECD seed layer, and a conventional ECD fill. Sixth, the ECD Seed (DOB) process includes deposition of a barrier layer, an ECD seed layer, and a conventional ECD fill. This is a DOB process because there is no deposition of a secondary seed, liner, or seed layer; rather, the ECD seed layer is deposited directly on a platable barrier layer.

Still referring to FIG. 2, the processes in accordance with embodiments of the present disclosure will now be described. Seventh, the ECD Seed Plus (DOB) process includes deposition of a barrier layer, an ECD seed "plus" deposit, and a conventional ECD fill and/or cap. Like the sixth example above, this is also a DOB process because there is no deposition of a secondary seed, liner, or seed layer; rather, the ECD seed layer is deposited directly on a platable barrier layer. Eighth, the ECD Seed Plus process includes deposition of a barrier layer, a secondary seed layer, an ECD seed "plus" deposit, and a conventional ECD fill and/or cap. Ninth, the ECD Seed Plus Without ECD process includes deposition of a barrier layer, a secondary seed layer, and an ECD seed "plus" deposit. Tenth, the ECD Seed Plus Without Secondary Seed process includes deposition of a barrier layer, a seed layer, an ECD seed "plus" deposit, and a conventional ECD fill and/or cap. Eleventh, the ECD Seed Plus With Liner and Seed process includes deposition of a barrier layer, a liner layer, a seed layer, an ECD seed "plus" deposit, and a conventional ECD fill and/or cap.

Referring to FIG. 7, another exemplary process in accordance with embodiments of the present disclosure is provided. In a first step, a workpiece having a barrier layer and a secondary seed layer is thermally treated or annealed prior to the ECD seed step to remove any surface oxides, densify the deposit, and improve the surface properties of the deposit. The seed layer shown in FIG. 7 is a secondary seed layer, but it should be appreciated that it may also be a seed layer or a stack film of a liner layer and a seed layer. Suitable thermal treatment or annealing conditions may include temperatures between about 200° C. to about 400° C. for about one (1) to about ten (10) minutes, possibly in forming gas or pure hydrogen. As mentioned above, the workpiece could alternatively be thermally treated in inert gas such as N2, argon (Ar) or helium (He). A reducing gas such as ammonia (NH3) may also be used.

In a second step, the workpiece is transferred to a deposition chamber for conformal deposition of an ECD seed layer. The thickness of the deposited film varies depending on the feature dimension and desired properties of the metal deposit.

In a third step, the workpiece is spun, rinsed with deionized (DI) water, and dried (SRD) to clean the workpiece.

In a fourth step, the workpiece is thermally treated or annealed at temperature in the range of 200° C. to 400° C. for reflow the metal into the feature.

In a fifth step, the workpiece may undergo sequential retreating of steps 2, 3, and 4, until a desired fill profile of the feature on the workpiece is obtained.

In a sixth step, the workpiece is subjected to conventional ECD acid chemistry deposition to achieve a desired thickness. The workpiece is then ready for subsequent processing, which may include additional thermal treatment, chemical mechanical polishing, and other processes.

Alternate embodiments of the process may include variations of the steps already described herein, and those steps, combinations and permutations may additionally be integrated into the following additional steps. It is envisioned in this disclosure that conformal "seed" deposition can be performed in basic solution or in acid solution, for example, in a pH range of about 4 to about 10, about 3 to about 10, or about 2 to about 11, with or without organic additives such as suppressors, accelerators, and/or levelers. Reflow may be performed using multiple deposition, cleaning (e.g., SRD), and thermal treatment or annealing steps or can be done in single step followed by thermal treatment or annealing at the appropriate temperature.

ECD seed "plus" deposition is important for the development of small features because the thermal treatment or annealing and reflowing steps provide for substantially void-free seed deposition. As described in greater detail below, void formation in the features increases the resistance (slows down the electrical performance of the device) and deteriorates the reliability of the interconnect.

Other advantages are realized by using the processes described herein. In that regard, a single tool for example a Raider® electrochemical deposition, cleaning (e.g., SRD), and thermal treatment or anneal tool, manufactured by Applied Materials, Inc., can be used for the ECD seed deposition step (or steps if repeated), the cleaning step (or steps if repeated), the thermal treatment step (or steps if repeated), and for the final ECD step. Moreover, the results show substantially void-free gap fill for small features using the processes described herein, resulting in lower resistance and resistive-capacitive (RC) delay values. In addition, the processes described herein provide the ability to fill a small feature on the order of less than about 30 nm, whereas fill may not be achieved using conventional processes. ECD seed "plus" deposition is also advantageous in features larger than 30 nm.

Figure 10:
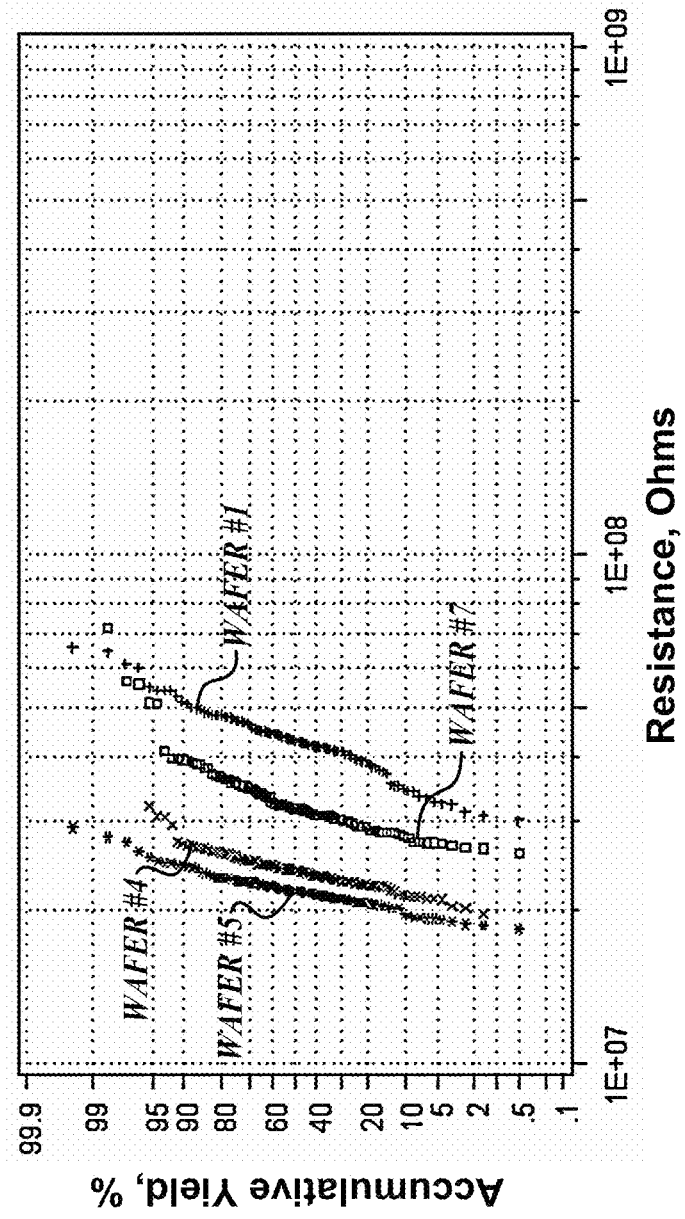
FIG. 10 is a graphical depiction of 1 meter long line resistor resistance results obtained from exemplary wafers described in FIG. 8.
Figure 11:
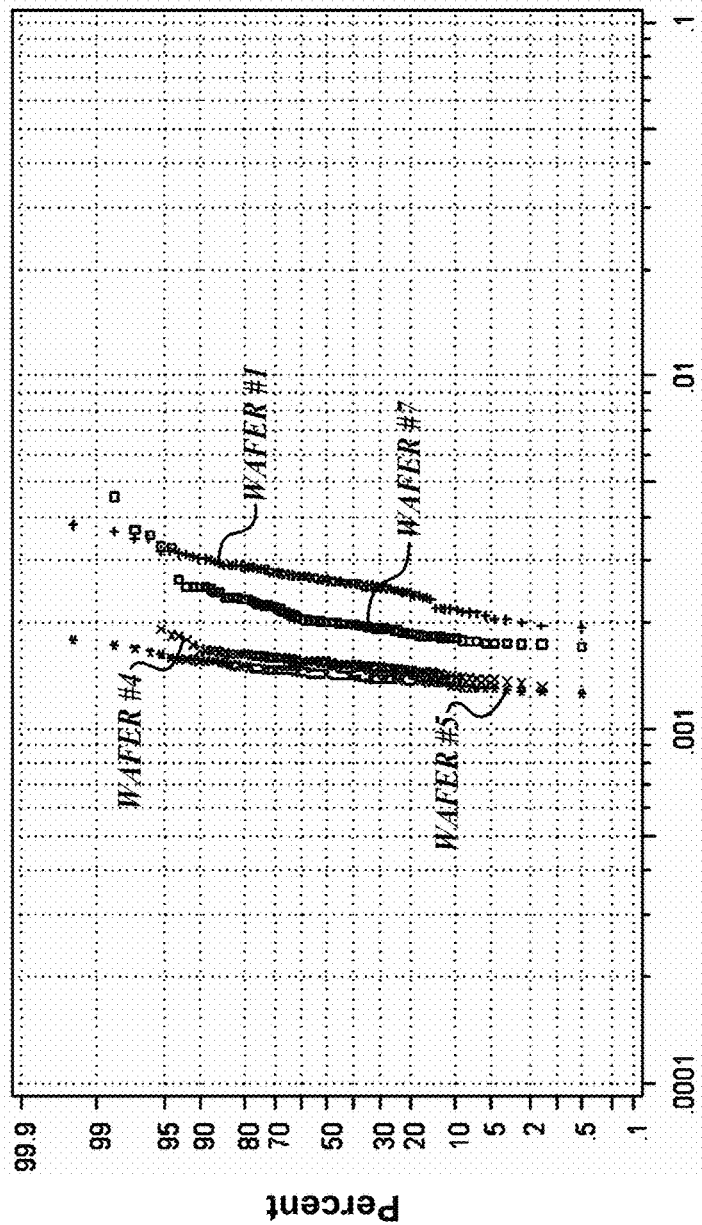
FIG. 11 is a graphical depiction of 1 meter long resistor resistive-capacitive delay results obtained from exemplary wafers described in FIG. 8.

As mentioned above, one or more layers of ECD seed may be applied and then exposed to an elevated temperature to fill deeper or high aspect ratio features. Referring to FIG. 8, two exemplary ECD seed plus processes (including annealing steps) are provided [Wafer 4 and Wafer 5], as compared to two conventional ECD seed process (without annealing steps) [Wafer 1 and Wafer 7] for deposition in Damascene features having feature diameters of about 30 nm. Referring to FIGS. 9 through 11, the results show that incremental deposition of the ECD seed in Damascene features, with some or all deposition steps followed by annealing step, results in reduced resistance and resistive-capacitive (RC) delay values as compared to a single step of ECD seed (i.e., without an anneal step).

All of Wafers 1, 4, 5, and 7 include the following initial process conditions: A barrier layer of 10 Å ALD TaN was deposited, followed by a seed layer (secondary seed) of 30 Å CVD Ru, and then the workpieces were subjected to an anneal at 300° C. with 10 minutes of nitrogen passivation.

Wafers 1 and 7 were then plated with a single step of ECD copper seed at, respectively, 2.1 amp-min and 0.5 amp-min, then were finished with fill and cap using a conventional acid ECD copper deposition process. The resultant workpieces produced a thick ECD copper seed (Wafer 1) and a thin ECD copper seed (Wafer 7).

Wafers 4 and 5 were subjected to ECD seed "plus" conditions. Wafer 4 included three ECD copper seed steps, each at 0.7 amp-min with a 300° C. anneal after each of the first two steps and no anneal after the third step, then finished with fill and cap using a conventional acid ECD copper deposition process. A microscopy image associated with Wafer 4, which has a feature size of approximately 30 nm, is provided in FIG. 12. Although there is no anneal after the third step, it should be appreciated that a final anneal step is also within the scope of the present disclosure.

Wafer 5 included four ECD copper seed steps, each at 0.5 amp-min with a 300° C. anneal after the first three steps and no anneal after the fourth step, then finished with fill and cap using a conventional acid ECD copper deposition process. Like Wafer 4, it should be appreciated that a final anneal step is also within the scope of the present disclosure.

Referring now to FIGS. 9 through 11, the comparative resistance and RC delay data for Wafers 1, 4, 5, and 7 is provided. As can be seen in FIGS. 9 through 11, the workpieces formed using ECD seed "plus" (Wafers 4 and 5) in accordance with methods described herein, have significantly reduced resistance and resistive/capacitive (RC) delay, as compared to workpieces formed using previously developed techniques (Wafers 1 and 7).

Referring to FIGS. 9 and 10, workpieces formed in accordance with embodiments of the present disclosure achieve resistance value reduction in the range of zero to about 40%, greater than zero to about 30%, greater than zero to about 20%, about 10% to about 20%, and about 10% to about 15%, as compared to workpieces formed using ECD seed, but without the ECD seed plus anneal cycle.

Referring to FIG. 11, workpieces formed in accordance with embodiments of the present disclosure achieve RC delay value reduction, as compared to workpieces formed using ECD seed, but without the ECD seed plus anneal cycle. Lower RC delay may result in lower or no damage to the low K inter-metal dielectric in the feature.

While illustrative embodiments have been illustrated and described, it will be appreciated that various changes can be made therein without departing from the spirit and scope of the disclosure.

The embodiments of the invention in which an exclusive property or privilege is claimed are defined as follows:

1. A method for filling a feature on a workpiece, the method comprising:
(a) obtaining a workpiece including a feature having a feature diameter of less than 30 nm, wherein the feature includes a conductive seed layer; (b) connecting the workpiece to an electric power supply and driving current to the workpiece; (c) using current, electrochemically depositing a first conformal conductive layer of a sufficient thickness in the feature and over a field surrounding the feature using a deposition electrolyte including metal ions selected from the group consisting of copper, cobalt, nickel, and alloys thereof, a metal ethylenediamine complex, and having a pH in the range of 8 to 11, wherein the first conformal conductive layer includes a metal selected from the group consisting of copper, cobalt, nickel, and alloys thereof, wherein the sufficient thickness of the deposited first conformal conductive layer is sufficient to fill the feature to a height at least level with the field upon reflowing the first conformal conductive layer; (d) completely filling the feature to a height that is at least level with the field upon reflowing the first conformal conductive layer with a first thermal treatment of the first conformal conductive layer; and (e) using current, electrochemically depositing a second conductive layer over the completely filled feature.

2. The method of claim 1, wherein thermally treating the workpiece reduces voids in the feature fill.

3. The method of claim 1, wherein the feature includes a barrier layer in the feature when obtained.

4. The method of claim 1, wherein metal for the conductive seed layer is selected from the group consisting of copper, cobalt, nickel, gold, silver, manganese, tin, aluminum, ruthenium, and alloys thereof.

5. The method of claim 1, wherein the conductive seed layer is selected from the group consisting of seed, secondary seed, and a stack film of seed and liner.

6. The method of claim 1, wherein the first conformal conductive layer is deposited using electroplating including at least one copper complex selected from the group consisting of copper ethylenediamine, citrate, tartrate, and urea.

7. The method of claim 1, wherein the second conductive layer is a cap layer.

8. The method of claim 7, wherein the cap layer is deposited using electroplating with acid bath.

9. The method of claim 1, wherein the thermal treatment temperature is in the range of about 100° C. to about 500° C.

10. The method of claim 1, wherein the thermally treated workpiece has a resistance value reduction in the range of greater than zero to about 40%, as compared to a workpiece formed without the step of thermally treating the workpiece.

11. A method for filling a feature on a workpiece, the method comprising:
 (a) obtaining a workpiece including a feature having a feature diameter of less than 30 nm, the feature including a barrier layer and a conductive seed layer;
 (b) connecting the workpiece to an electric power supply and driving current to the workpiece;
 (c) using current, electrochemically depositing a first conformal conductive layer of a sufficient thickness in the feature and over a field surrounding the feature using a deposition electrolyte including metal ions selected from the group consisting of copper, cobalt, nickel, and alloys thereof, a metal ethylenediamine complex, and having a pH in the range of 8 to 11, wherein the first conformal conductive layer includes a metal selected from the group consisting of copper, cobalt, nickel, and alloys thereof, wherein the sufficient thickness of the deposited first conformal conductive layer is sufficient to fill the feature to a height at least level with the field upon reflowing the first conformal conductive layer;
 (d) a single annealing of the workpiece to reflow the first conformal conductive layer in the feature, wherein the reflowed first conformal conductive layer completely fills the feature to a height that is at least level with the field in the single annealing of the workpiece; and
 (e) electrochemically depositing a second conductive layer over the completely filled feature.

12. The method of claim 1, wherein the gas used for thermal treatment has a hydrogen concentration in the range of 3-5% in a carrier gas.

13. The method of claim 12, wherein the carrier gas is selected from the group consisting of nitrogen, argon, helium, and ammonia.

14. The method of claim 11, wherein the conductive seed layer includes a metal selected from the group consisting of copper, ruthenium, cobalt, nickel, and alloys thereof.

15. A method for filling a feature on a workpiece, the method substantially consisting of:
 (a) obtaining a workpiece including a feature having a feature diameter of less than 30 nm;
 (b) connecting the workpiece to an electric power supply and driving current to the workpiece;
 (c) using current, electrochemically depositing a first conformal conductive layer of a sufficient thickness in the feature and over a field surrounding the feature using a deposition electrolyte including metal ions selected from the group consisting of copper, cobalt, nickel, and alloys thereof, a metal ethylenediamine complex, and having a pH in the range of 8 to 11, wherein the first conformal conductive layer includes a metal selected from the group consisting of copper, cobalt, nickel, and alloys thereof, wherein the sufficient thickness of the deposited first conformal conductive layer is sufficient to fill the feature to a height at least level with the field upon reflowing the first conformal conductive layer;
 (d) thermally treating the workpiece in a first thermal treatment to reflow the first conformal conductive layer in the feature to a height that is at least level with the field, wherein the reflowed first conformal conductive layer completely fills the feature; and
 (e) electrochemically depositing a second conductive layer over the completely filled feature.

16. The method of claim 15, wherein the feature includes a barrier layer.

17. The method of claim 15, wherein the feature includes a conductive seed layer.

18. The method of claim 17, wherein the conductive seed layer includes a metal selected from the group consisting of copper, ruthenium, cobalt, nickel, and alloys thereof.

* * * * *